United States Patent
Long et al.

(10) Patent No.: US 12,417,900 B2
(45) Date of Patent: Sep. 16, 2025

(54) PLASMA PROCESSING APPARATUS

(71) Applicants: Beijing E-Town Semiconductor Technology Co., Ltd., Beijing (CN); Mattson Technology, Inc., Fremont, CA (US)

(72) Inventors: Maolin Long, Santa Clara, CA (US); Weimin Zeng, San Jose, CA (US); Yu Guan, Pleasanton, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 453 days.

(21) Appl. No.: 17/751,048

(22) Filed: May 23, 2022

(65) Prior Publication Data

US 2022/0415619 A1 Dec. 29, 2022

Related U.S. Application Data

(60) Provisional application No. 63/215,000, filed on Jun. 25, 2021.

(51) Int. Cl.
*H01J 37/32* (2006.01)

(52) U.S. Cl.
CPC ...... *H01J 37/32522* (2013.01); *H01J 37/321* (2013.01); *H01J 37/32651* (2013.01);
(Continued)

(58) Field of Classification Search
CPC .............. H01J 37/321; H01J 37/32651; H01J 37/32522; H01J 2237/002; H01J 2237/334; H01J 37/32183; H01J 2237/2001

See application file for complete search history.

(56) References Cited

U.S. PATENT DOCUMENTS

| 2,137,162 | A | 11/1938 | Hile |
| 4,070,083 | A | 1/1978 | DiPalma |

(Continued)

FOREIGN PATENT DOCUMENTS

| CN | 104302084 | 1/2015 |
| CN | 104576278 | 4/2015 |

(Continued)

OTHER PUBLICATIONS

Lee, Thermal conductivity of anodized aluminum oxide layer: The effect of electrolyte and temperature, 2013, Materials Chemistry and Physics vol. 141, Issues 2-3, Sep. 16, 2013, pp. 680-685 (Year: 2013).*

(Continued)

*Primary Examiner* — Yuechan Yu
(74) *Attorney, Agent, or Firm* — Dority & Manning, P.A.

(57) ABSTRACT

A plasma processing apparatus including a processing chamber having one or more sidewalls and a dome is provided. The plasma processing apparatus includes a workpiece support disposed in the processing chamber configured to support a workpiece during processing, an induction coil assembly for producing a plasma in the processing chamber, a Faraday shield disposed between the induction coil assembly and the dome, the Faraday shield comprising an inner portion and an outer portion, and a thermal management system. The thermal management system including one or more heating elements configured to heat the dome, and one or more thermal pads disposed between an outer surface of the dome and the heating elements, wherein the one or more thermal pads are configured to facilitate heat transfer between the one or more heating elements and the dome. Thermal management systems and methods for processing workpieces are also provided.

19 Claims, 7 Drawing Sheets

(52) U.S. Cl.
CPC ... *H01J 37/32183* (2013.01); *H01J 2237/002* (2013.01); *H01J 2237/2001* (2013.01); *H01J 2237/334* (2013.01)

(56) References Cited

U.S. PATENT DOCUMENTS

| | | | | |
|---|---|---|---|---|
| 6,149,760 | A | * | 11/2000 | Hama ...................... H05H 1/46 |
| | | | | 156/345.48 |
| 6,177,646 | B1 | | 1/2001 | Okumura et al. |
| 8,920,600 | B2 | | 12/2014 | Godyak |
| 2002/0100557 | A1 | * | 8/2002 | Li ........................ H01J 37/321 |
| | | | | 118/724 |
| 2004/0129221 | A1 | | 7/2004 | Brcka et al. |
| 2004/0194890 | A1 | | 10/2004 | Moroz |
| 2006/0174834 | A1 | | 8/2006 | Long et al. |
| 2012/0152901 | A1 | | 6/2012 | Nagorny et al. |
| 2014/0020835 | A1 | | 1/2014 | Nguyen et al. |
| 2014/0021861 | A1 | | 1/2014 | Carducci et al. |
| 2014/0342568 | A1 | | 11/2014 | Sant et al. |
| 2015/0020969 | A1 | * | 1/2015 | Sriraman .......... H01J 37/32963 |
| | | | | 156/345.24 |
| 2015/0191823 | A1 | * | 7/2015 | Banna ...................... H05B 6/02 |
| | | | | 219/635 |
| 2018/0240652 | A1 | * | 8/2018 | Ma .................... H01J 37/32651 |

FOREIGN PATENT DOCUMENTS

| | | |
|---|---|---|
| CN | 104717817 | 6/2015 |
| CN | 110301030 | 10/2019 |
| CN | 211957596 | 11/2020 |
| JP | H10256238 | 9/1998 |
| JP | 2015529938 | 10/2015 |
| JP | 2016184727 | 10/2016 |
| WO | WO 2014014566 | 1/2014 |

OTHER PUBLICATIONS

Zhang et al. "Thermal Conductivity of Aluminum Alloys—A Review," Materials 2023, 16, 2972, https://doi.org/10.3390/ma16082972, published Apr. 8, 2023, 21 pages.

ThermoConductivity Blog, "Materials with high thermal conductivity," retrieved from internet from "https://termopasty.com/en/materials-with-high-thermal-conductivity/" on Feb. 28, 2025, 1 page.

* cited by examiner

PLASMA PROCESSING APPARATUS

The present application claims the benefit of priority of U.S. Application Ser. No. 63/215,000, titled "PLASMA PROCESSING APPARATUS," filed Jun. 25, 2021, which is incorporated herein by reference for all purposes.

BACKGROUND

Field

RF plasmas are used in the manufacture of devices such as integrated circuits, micromechanical devices, flat panel displays, and other devices. RF plasma sources used in modern plasma etch applications are required to provide a high plasma uniformity and a plurality of plasma controls, including independent plasma profile, plasma density, and ion energy controls. RF plasma sources typically must be able to sustain a stable plasma in a variety of process gases and under a variety of different conditions (e.g. gas flow, gas pressure, etc.). In addition, it is desirable that RF plasma sources produce a minimum impact on the environment by operating with reduced energy demands and reduced EM emission.

Problems associated with plasma processing require that portions of the processing chamber, which hold the workpiece, must be preheated to certain temperatures before plasma processing can begin. Certain heating elements or even plasma generated in the chamber can be used to heat portions of the processing chamber. However, such pre-heating methods can be timely and costly. Accordingly, improved plasma processing apparatuses and systems are needed.

SUMMARY

Aspects and advantages of embodiments of the present disclosure will be set forth in part in the following description, or may be learned from the description, or may be learned through practice of the embodiments.

Aspects of the present disclosure are directed to a plasma processing apparatus including a processing chamber having one or more sidewalls and a dome, a workpiece support disposed in the processing chamber configured to support a workpiece during processing, an induction coil assembly for producing a plasma in the processing chamber, a Faraday shield disposed between the induction coil assembly and the dome, the Faraday shield comprising an inner portion and an outer portion, and a thermal management system. The thermal management system including one or more heating elements configured to heat the dome, and one or more thermal pads disposed between an outer surface of the dome and the heating elements, wherein the one or more thermal pads are configured to facilitate heat transfer between the one or more heating elements and the dome.

Aspects of the present disclosure are also directed to a thermal management system for a plasma processing apparatus. The thermal management system includes one or more heating elements configured to heat a dome of a processing chamber, one or more thermal pads disposed between an outer surface of the dome and the one or more heating elements, wherein substantially no air gas exist between the dome and the thermal pads and the heating elements and the thermal pads, an air amplifier configured to provide a flow of air to cool the dome; and a controller, the controller configured to operate the thermal management system in a closed-loop manner in order to maintain the dome at a set point temperature.

Aspects of the present disclosure are also directed to methods for processing a workpiece in a plasma processing apparatus. The plasma processing apparatus including a processing chamber having a dome, and a workpiece support disposed in the processing chamber configured to support the workpiece during processing. The method includes pre-heating the dome to a set point temperature; placing a workpiece on the workpiece support in the processing chamber; exposing the workpiece to a treatment process; maintaining the set point temperature of the dome during the treatment process using a thermal management system. The thermal management system includes one or more heating elements configured to heat the dome; and one or more thermal pads disposed between an outer surface of the dome and the heating elements, wherein the one or more thermal pads are configured to facilitate heat transfer between the one or more heating elements and the dome.

Aspects of the present disclosure are also directed to a plasma processing apparatus, including a processing chamber having one or more sidewalls and a dome; a workpiece support disposed in the processing chamber configured to support a workpiece during processing; two or more plasma induction coil assemblies including an inner coil assembly and an outer coil assembly for producing a plasma in the processing chamber; a first power source coupled to the inner coil assembly and a second power source coupled to the outer coil assembly, such that a different power combination and/or a different power configuration can be implemented between the inner coil assembly and the outer coil assembly that can be configured to tune plasma uniformity; a first Faraday shield disposed between the inner coil assembly and the dome and a second Faraday shield disposed between the outer coil assembly and the dome; and a thermal management system. The thermal management system including one or more inner heating elements attached to a bottom surface of the first Faraday shield and one or more outer heating elements attached to a bottom surface of the second Faraday shield; and one or more first thermal pads disposed between an outer surface of the dome and the one or more inner heating elements configured to facilitate heat transfer between the one or more inner heating elements and the dome, and one or more second thermal pads disposed between the outer surface of the dome and the one or more outer heating elements configured to facilitate heat transfer between the one or more outer heating elements and the dome.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
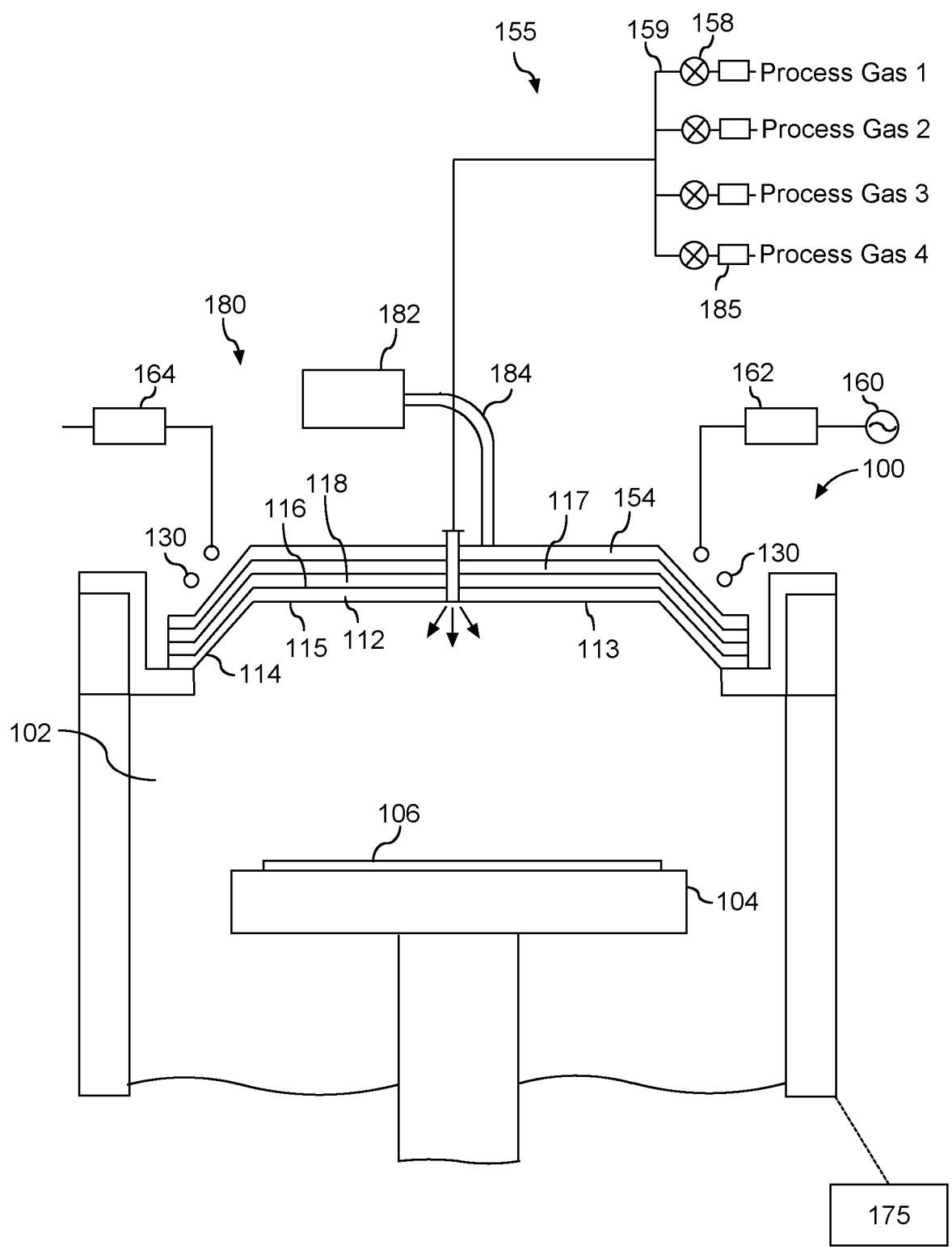
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

As used herein, use of the term "about" in conjunction with a stated numerical value can include a range of values within 10% of the stated numerical value.

The term "substantially" can be used herein. For example, in embodiments the phrase "substantially no air gaps" is used regarding placement of one or more thermal pads with respect to one or more heating elements and the dome. In such embodiments, substantially refers to at least 80% of the space between the thermal pads and dome including no air gaps, such as at least 90%, such as at least 95%. In certain embodiments, "substantially no air gaps" refers to no air gaps being present between the thermal pads and either the one or more heating elements and/or the dome. For example, "substantially no air gaps" can refer to an embodiment where no air gaps exist between the dome, the thermal pads, and one or more heating elements.

Conventional plasma processing apparatuses generally include a processing chamber for treating one or more workpiece with plasma. Such chambers, generally include a plasma generation source (e.g., an induction coil) disposed on or around at least a portion of the chamber. Often times, the walls of the processing chamber can be formed from a dielectric material (e.g., ceramic). Prior to processing workpieces, the walls of the processing chamber including the dome of the processing chamber must be heated to a set point temperature in order to facilitate plasma processing. Accordingly, heaters or heating elements can be disposed on or around the dome of the processing chamber in order to heat the processing chamber to a set point temperature. However, such heating elements often suffer from many drawbacks, one of those being that due to inefficient heat transfer between the heating elements and the dome, heating to set point temperature can take a long time. Additionally, certain heating elements may not be able to either effectively heat the dome to a set point temperature and/or to maintain the dome at set point temperature during processing.

Accordingly, provided herein are plasma processing apparatuses that include a processing chamber having one or more sidewalls and a dome. The apparatuses include a workpiece support disposed in the processing chamber configured to support a workpiece during processing and an induction coil assembly for inducing a plasma in the processing chamber. A Faraday shield is disposed between the induction coil assembly and the processing chamber. The Faraday shield includes an inner portion and an outer portion. The apparatus also includes a thermal management system. The thermal management system includes one or more heating elements configured to heat the dome and one or more thermal pads disposed between an outer surface of the dome and the heating elements. The one or more thermal pads are configured to facilitate heat transfer between the one or more heating elements and the dome. Optionally, the thermal management system can include an air amplifier configured to provide a flow of air or gas to cool the dome. The thermal management system can be controlled using a controller. The controller can be used to control the thermal management system in a closed-loop manner.

Further, in embodiments, provided are plasma processing apparatuses having a processing chamber having one or more sidewalls and a dome. The plasma processing apparatus includes a workpiece support disposed in the processing chamber configured to support a workpiece during processing. In embodiments, two or more plasma induction coil assemblies including an inner coil assembly and an outer coil assembly for producing a plasma in the processing chamber are provided. Further provided is a first power source coupled to the inner coil assembly and a second power source coupled to the outer coil assembly, such that a different power combination and/or a different power configuration can be implemented between the inner coil assembly and the outer coil assembly. Such a different power combination and/or different power configuration can be used to tune plasma uniformity to achieve desired processing results. Further the apparatus includes a first Faraday shield disposed between the inner coil assembly and the dome and a second Faraday shield disposed between the outer coil assembly and the dome. The apparatus also includes a thermal management system including one or more inner heating elements attached to a bottom surface of the first Faraday shield and one or more outer heating elements attached to a bottom surface of the second Faraday shield. One or more first thermal pads are disposed between an outer surface of the dome and the one or more inner heating elements and are configured to facilitate heat transfer between the one or more inner heating elements and the dome. One or more second thermal pads are disposed between the outer surface of the dome and the one or more outer heating elements configured to facilitate heat transfer between the one or more outer heating elements and the dome. Optionally, the thermal management system can be controlled using a controller. The controller can be used to control the thermal management system in a closed-loop manner.

The plasma processing apparatus according to example embodiments of the present disclosure can provide numerous benefits and technical effects. For instance, the thermal management system includes one or more heating elements configured to heat the dome having one or more thermal pads disposed between the heating elements and the dome in order to facilitate heat transfer between the heating elements and the dome. In such configurations, there are no air gaps between the dome and the heating elements, due to the placement of the thermal pads, which allows for more efficient thermal transfer of heat from the heating elements to the dome. Such efficient heat transfer enables the heating elements to heat the dome to a set point temperature much faster as compared to other conventional plasma processing apparatuses. Additionally, utilization of the thermal management system as disclosed does not negatively affect plasma processing treatments conducted. For example, process uniformity and/or wafer uniformity are not negatively affected. Furthermore, utilization of the thermal management system provided does not require plasma induction or the utilization of dummy wafers in order to effectively heat the dome, which significantly reduces manufacturing time and costs. The thermal management system is capable of reaching and maintaining dome set point temperatures using a closed-loop feedback system.

FIG. 1 depicts a plasma processing apparatus 100 according to an example embodiment of the present disclosure. The plasma processing apparatus 100 includes a processing chamber 109 defining an interior space 102. A workpiece support 104 (e.g., pedestal) is used to support a workpiece 106, such as a semiconductor wafer, within the interior space 102. Workpiece support 104 can include one or more support pins, such as at least three support pins, extending from workpiece support 104. (Not shown). In some embodiments, workpiece support 104 can be spaced from the top of the processing chamber 109, such as spaced from dome 112. A dome 112 is located above the workpiece support 104. The processing chamber 109 includes one or more sidewalls 111 and a dome 112. The dome 112 can include a relatively flat central portion 113 and an angled peripheral portion 114. While such embodiments of a dome 112 are disclose, the dome 112 can be any suitable shape. For example, in certain embodiments the dome 112 may be formed from a relatively flat portion with no angled peripheral portions. In certain other embodiments, the dome 112 can be in the shape of a sphere. Any suitable dome shape can be used according to the disclosure provided. The dome 112 has a first surface 115 facing the interior space 102 of the processing chamber 109 and a second surface 116 opposite from the first surface 115 that faces externally. The first surface 115 of the dome 112 forms the interior top wall of the processing chamber 109. The dome 112 can be formed from a dielectric material.

As shown in FIG. 1, according to example aspects of the present disclosure, the apparatus 100 can include a gas delivery system 155 configured to deliver process gas to the processing chamber 109, for instance, via a gas distribution channel or other distribution system (e.g., showerhead). The gas delivery system 155 can include a plurality of feed gas lines 159. The feed gas lines 159 can be controlled using valves 158 and/or gas flow controllers 185 to deliver a desired amount of gases into the processing chamber 109 as process gas. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the processing chamber 109. In embodiments, the gas delivery system 155 can be controlled with a gas flow controller 185.

The apparatus 100 further includes and induction coil assembly including one or more inductive elements for generating an inductive plasma in the interior space 102 of the processing chamber. The inductive elements can include an induction coil 130 that when supplied with RF power, induces a plasma in the process gas in the interior space 102 of plasma processing apparatus 100. For instance, a RF generator 160 can be configured to provide electromagnetic energy through a matching network 162 to the induction coil 130. Further, the first induction coil 130 can be coupled to ground via a capacitor 164. While only one induction coil 130 is shown, the disclosure is not so limited. Indeed, any number of induction coils can be utilized with the plasma processing apparatus 100 provided herein. For example, the apparatus 100 can include at least two inductions coils or at least three induction coils. Additional induction coils can be coupled to an RF power source similar to induction coil 130. For example, certain embodiments incorporating at least two induction coils assemblies will be further discussed hereinbelow.

In embodiments, the apparatus 100 can include a controller 175. The controller 175 controls various components in processing chamber 109 to direct processing of workpiece 106. For example, controller 175 can be used to control one or more heating elements 117 or other elements associated with the thermal management system disclosed herein. The controller 175 can also implement one or more process parameters, such as controlling the gas flow controllers 185 and altering conditions of the processing chamber 109 in order to maintain suitable conditions in the processing chamber 109 curing during processing of the workpiece 106. The controller 175 can include, for instance, one or more processors and one or more memory devices. The one or more memory devices can store computer-readable instructions that, when executed by the one or more processors, cause the one or more processors to perform operations, such as any of the control operations described herein.

As mentioned, for certain plasma processing procedures, it is desirable to heat the dome 112 to a certain temperature (e.g., a set point temperature) to ensure proper plasma processing and workpiece uniformity. Accordingly, one or more heating elements 117 are disposed adjacent to the second surface 116 of the dome 112. For example, one or more heating elements 117 can be disposed in close proximity to the second surface 116 of the dome 112 without making contact with the second surface 116 of the dome 112. In certain embodiments, the heating elements 117 can be disposed on a portion (e.g., an inner portion and/or an outer portion) of the Faraday shield 154 as will be further discussed hereinbelow. The heating elements 117 can include any suitable heating element including electrodes, lamps, or combinations thereof. In certain embodiments, the heating elements 117 can include one or more electrically-charged films capable of generating and emitting heat. As described, any suitable heating element can be used in accordance with the example embodiments disclosed herein. The heating elements 117 are configured to be connected to any suitable power source (e.g., DC power source, AC power source, and/or RF power source). For example, in certain embodiments, the heating elements 117 are coupled to an AC power source. The heating elements 117 can be configured to heat and/or operate at an operating temperature. For example, in certain embodiments, the heating elements 117 can be configured to heat at an operating temperature of from about 70° C. to about 200° C. The actual operating temperature of the heating elements 117 can be controlled by controller 175. In certain embodiments, the operating temperature of the heating elements 117 can be controlled in a closed-loop manner, as will be discussed further hereinbelow.

One or more thermal pads 118 are disposed between the heating elements 117 and the dome 112. For example, one or more thermal pads 118 can be disposed between the heating elements 117 and the second surface 116 of the dome 112. The thermal pads 118 can be disposed such that they are in physical contact with both the heating elements 117 and the dome 112, thereby eliminating any air gaps between the dome 112 and the heating elements 117. For example, the thermal pads 118 can be disposed such that no air gaps exists between the thermal pad 118 and the dome 112. Furthermore, the thermal pads 118 can be disposed such that no air gaps exist between the heating elements 117 and the thermal pads 118. Accordingly, given that the thermal pads 118 eliminate any air gaps between the dome 112 and the heating elements 117, heat is transferred from the heating elements 117 to the dome 112 via conduction mechanisms, which can more effectively transfer heat as compared to radiation heating mechanisms.

The thermal pads 118 can be any suitable conductive material. In embodiments, the thermal pads 118 have a thickness of from about 10 mil to about 100 mil. In such embodiments, the thickness of the thermal pads 118 should be selected so as not to impede heat transfer between the heating elements 117 and the dome 112. For example, utilization of a thermal pad 118 that is too thick can actually reduce heat transfer between the heating elements 117 and the dome 112, which is not desirable. Furthermore, disposition of an unsuitably thick thermal pad 118 between the heating elements 117 and the dome 112, can subject the dome 112 and/or heating elements 117 to additional physical stresses, which can be undesirable. For example, utilization of a thermal pad 118 that is too thick can cause additional stress to build on the dome 112, which can cause the dome 112 to crack and/or break. Furthermore, disposition of the thermal pads 118 between the dome 112 and the heating elements 117 can subject the thermal pads 118 to a certain degree of compression. For example, the thermal pads 118 can be compressed to a degree of compression corresponding to about 10% to about 40% of the original volume of the thermal pads 118. Stated differently, the thermal pads 118 can be compressed to about 10% to about 40% of their original volume when disposed between the dome 112 and the heating elements 117. Similar to the thickness of the thermal pads 118, utilization of a higher degree of compression (e.g., attempting to compress the thermal pad 118 above 50% of their original volume) can cause stress and strain to build across the dome surface, which can cause the dome to crack.

The thermal pads 118 can be composed of any suitable material capable of facilitating heat transfer between the heating elements 117 and the dome 112. For example, the thermal pads 118 can have high thermal conductivity and a high electrical resistivity with a low loss tangent in the range of the operating frequency of the RF power used during a plasma etch process. For example, the one or more thermal pads 118 can have a thermal conductivity of from about 0.5 W/m-K to about 1.5 W/m-K in accordance with ASTM D5470.

Furthermore, certain features of the apparatus 100 are part of a thermal management system 180. For example, the thermal management system 180 can include the heating elements 117 and the thermal pads 118. The thermal management system 180 can also include an air amplifier 182 configured to provide a flow of air or other suitable gas to cool the dome 112. For example, during processing, plasma is generated in the interior space 102 of the processing chamber 109. Generation of plasma in the interior space 102 can actually heat the first surface 115 of the dome 112. Accordingly, during processing, it may be desirable to cool the dome 112, such that the dome 112 can maintain a set point temperature for processing. In certain embodiments, the air amplifier 182 can be coupled to an air tube 184, the air tube 184 is configured to deliver air or gas to the dome 112. As will be further discussed below, the air amplifier 182 can deliver gas through the Faraday shield 154 via one or more apertures located in the Faraday shield 154. Such apertures ensure that an adequate amount of air or gas can reach the dome 112 in order to more effectively cool the dome.

The components of the thermal management system 180 can be controlled in a closed-loop manner with a controller (e.g., controller 175). For instance, a closed-loop system can be utilized to maintain a set point temperature for the dome 112. The closed-loop system disclosed will utilize controller 175 as reference, however, the disclosure is not so limited. In fact, additional controllers can be added to the apparatus 100 and utilized to operate components of the thermal management system 180. A closed-loop system (or controlling in closed-loop manner) generally described a system that uses feedback, such as a portion of an output parameter, in order to create a feedback loop providing data to a controller. Once the feedback data is received by the controller, the controller adjusts the operation of certain components of the system. In embodiments disclosed herein, the thermal management system 180 can be operated via controller 175 in a closed-loop manner. For example, in certain embodiments the set point temperature can be set to 90° C. Accordingly, the controller 175 can operate the heating elements 117 in order to heat the dome 112 to the set point temperature. Once the set point temperature is achieved, processing of workpieces 106 in the processing chamber 109 can begin. During processing, plasma generated in the processing chamber 109 can cause the temperature of the dome 112 to increase. Accordingly, when the controller 175 receives feedback that the dome temperature 112 is increasing from set point temperature, the controller 175 can operate the air amplifier 182 in order to cool the dome back to set point temperature. Similarly, if the controller 175 receives feedback that the dome temperature is less than the set point temperature, the controller 175 can operate the heating elements 117 in order to increase the temperature of the dome 112. In such closed-loop systems, one or more sensors can be used to monitor the temperature of the dome 112 in order to provide feedback data to the controller 175. In embodiments, the set point temperature can range from about 50° C. about 150° C.

According to aspects of the present disclosure, the apparatus 100 includes a Faraday shield 154 disposed between the induction coil 130 and the processing chamber 109. For example, in certain embodiments the apparatus 100 includes a Faraday shield 154 disposed between the induction coil 130 and the dome 112. Faraday shield 154 can be a slotted metal shield that reduces capacitive coupling between the induction coil 130 and/or second induction coil 140 and the interior space 102 of the process chamber. As illustrated, Faraday shield 154 can fit over the angled portion of the dome 112. Portions of the multi-turn coil of the first induction coil 130 can be located adjacent the Faraday shield 154. The Faraday shield 154 can be grounded. Embodiments of the Faraday shield 154 will be further discussed hereinbelow.

Figure 2:
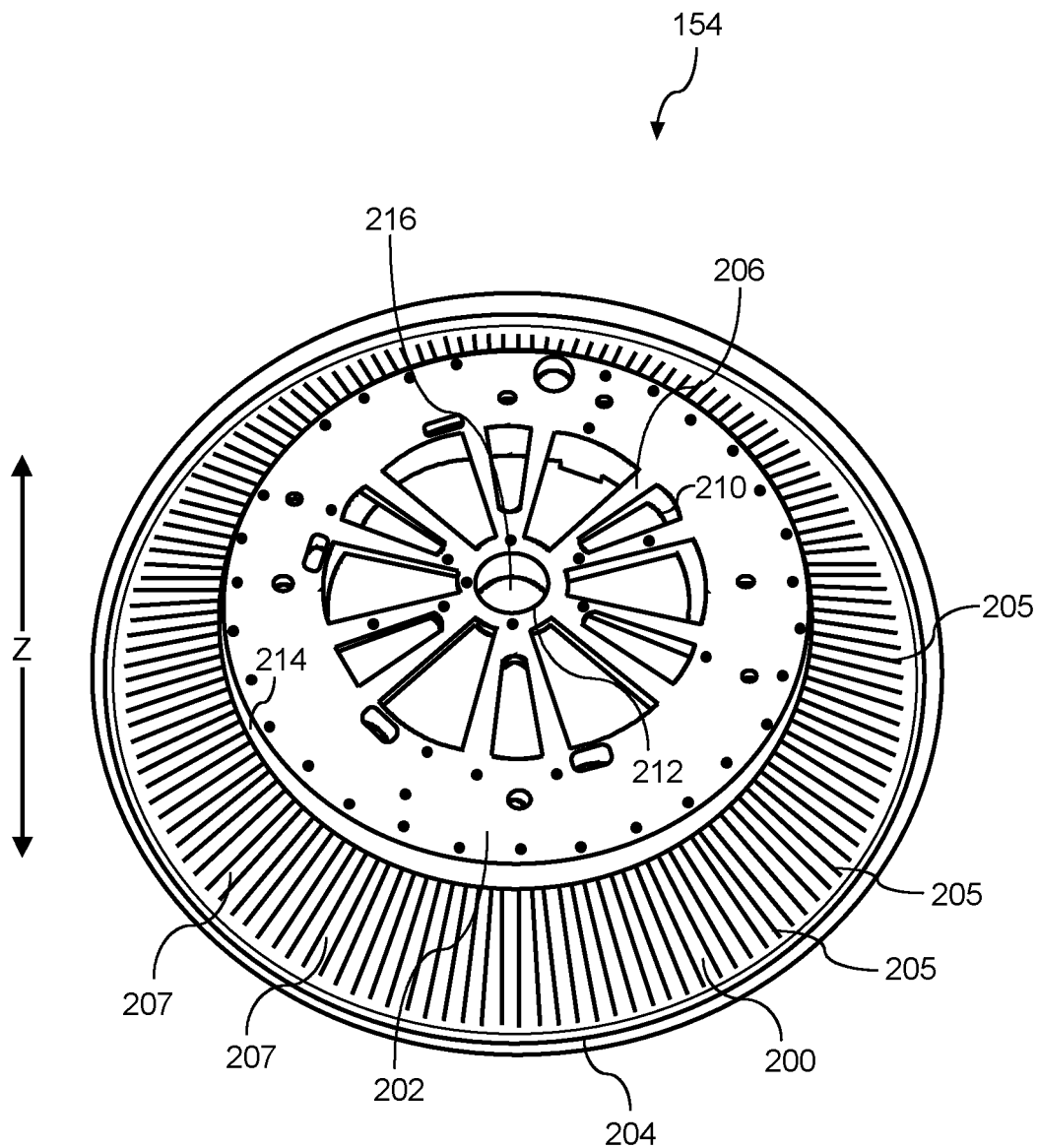
FIG. 2 depicts an example top down view of a Faraday shield for a plasma processing apparatus according to example embodiments of the present disclosure.
Figure 3:
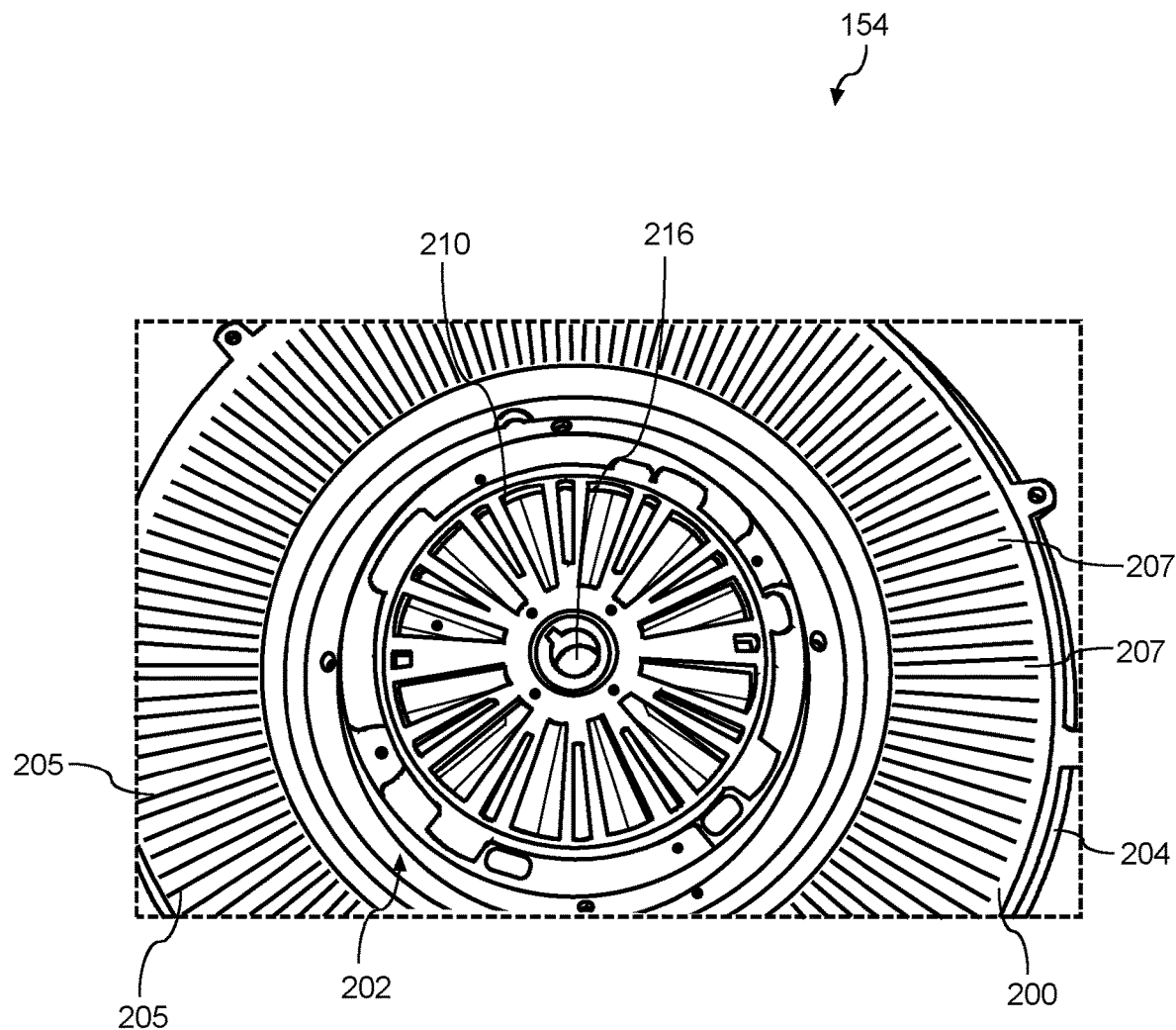
FIG. 3 depicts an example bottom up view of a Faraday shield for a plasma processing apparatus according to example embodiments of the present disclosure.

As shown in FIGS. 2-3, the Faraday shield 154 can include an outer portion 200 and an inner portion 202. The inner portion 202 can be in a raised position as compared to the outer portion 200. For example, the inner portion 202 can be raised in the Z-direction as compared to the outer portion 202. As shown the outer portion 200 includes one or more apertures 205 extending from the inner portion 202 to an outer perimeter 204 of the Faraday shield 154. The one or more apertures 205 can be thin apertures, such as slots. One or more spokes 207 can be disposed between the one or more apertures 205. The inner portion 202 can include any suitable configuration. For example, in certain embodiments, the inner portion 202 includes a wheel and spoke configuration. As shown, one or more spokes 206 can be disposed between an inner perimeter 212 and an outer perimeter 214 of the inner portion 202. As shown, one or more apertures 210 are disposed between the one or more spokes 206. The one or more apertures 210 can be configured to receive air or gas flow from the air amplifier 182. Furthermore, the one or more apertures 210 can be configured to facilitate the flow of air or gas from the air amplifier 182 to an external surface 116 of the dome 112.

Furthermore, the Faraday shield 154 can include a center aperture 216. The center aperture 216 can be configured to run one or more gas lines from the gas delivery system 155 through the top of the apparatus 100 in order to supply process gas to the interior 102 of the processing chamber 109. Furthermore, in certain embodiments, the center aperture 216 can be configured to be coupled to the air tube 184 such that air and/or gas from the air amplifier 182 can be delivered to the dome 112 in order to more efficiently cool the dome 112. In such embodiments, air and/or gas delivered by the air tube 184 can be delivered to the dome 112 and then can be dispersed from the dome surface via the one or more apertures 210 located in the inner portion 202 of the Faraday shield 154.

Figure 4:
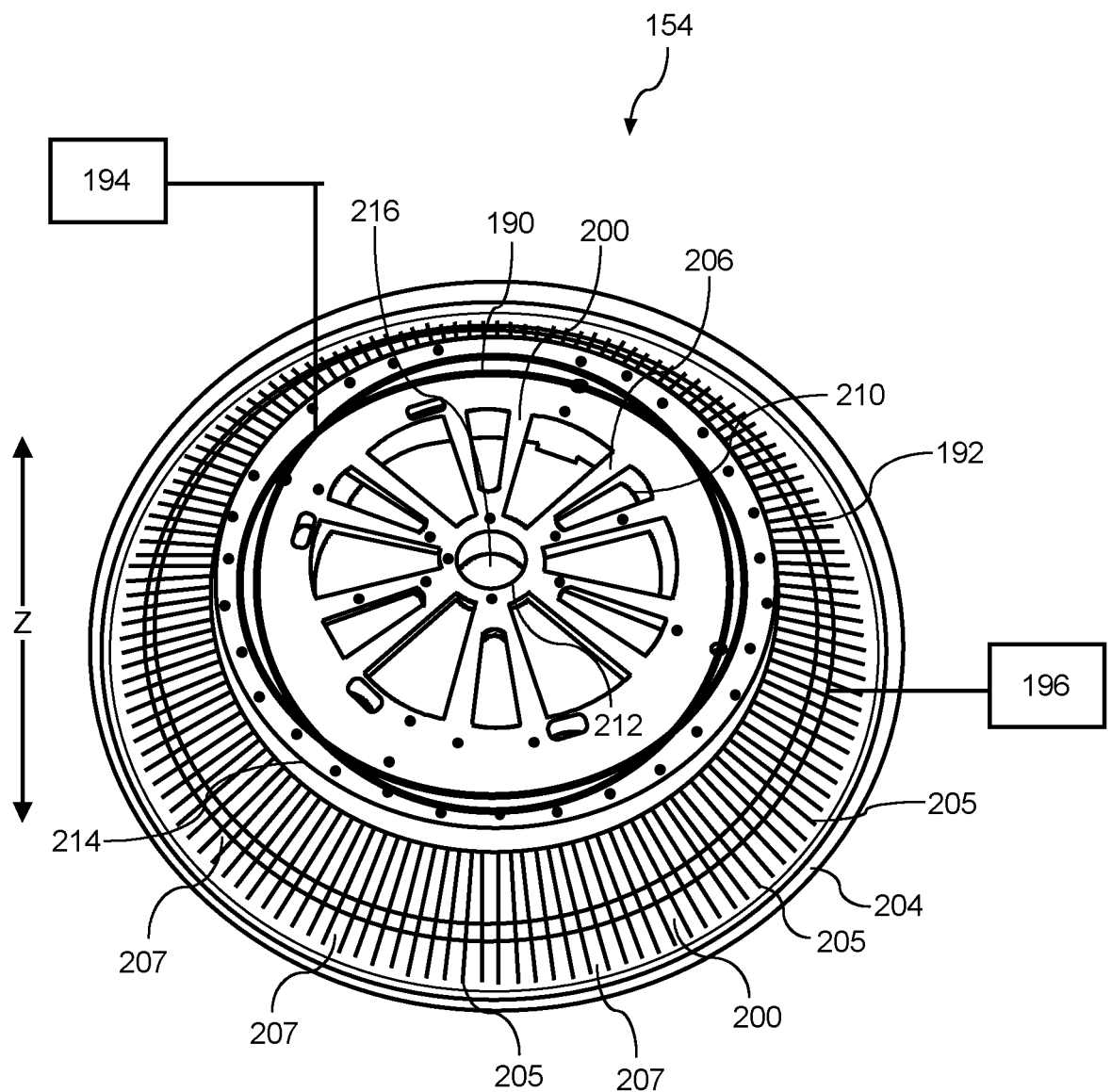
FIG. 4 depicts an example top down view of a Faraday shield with induction coils for a plasma processing apparatus according to example embodiments of the present disclosure.

Referring now to FIG. 4, as noted above, one or more induction coil assemblies (130,140) can be placed adjacent to either and/or both of the inner portion 202 and/or the outer portion 200 of the Faraday shield 154. For example, in embodiments an inner coil assembly 190 can be disposed adjacent to the inner portion 202 of the Faraday shield 154. An outer coil assembly 192 can be disposed adjacent to the outer portion 200 of the Faraday shield 154. In such embodiments, each of the inner coil assembly 190 and the outer coil assembly 190 can be electrically coupled to the same power source or can be coupled to different power sources. For example, a first power source 194 can be coupled to the inner coil assembly 190 and a second power source 196 can be coupled to the outer coil assembly 192. The first power source 194 and the second power source 196 can include any suitable DC power source, AC power source, RF power source, or combinations thereof. In embodiments, each of the coil assemblies can be operated with different power combinations and/or power configurations in order to adjust plasma uniformity in the processing chamber. For example, different amounts of power or power configurations can be implemented between the inner coil assembly 190 and the outer coil assembly 192 in order to tune plasma uniformity. Such ability to tune plasma uniformity can ensure desired workpiece processing, including desired workpiece processing uniformity is achieved. More specifically, in embodiments first power source 194 can be a 2 MHz RF power source having an output power ranging from about 100 W to about 3 kW, while the second power source 196 is a 13.56 MHz RF power source having an output power ranging from abut 100 W to about 5 kW.

Figure 5:
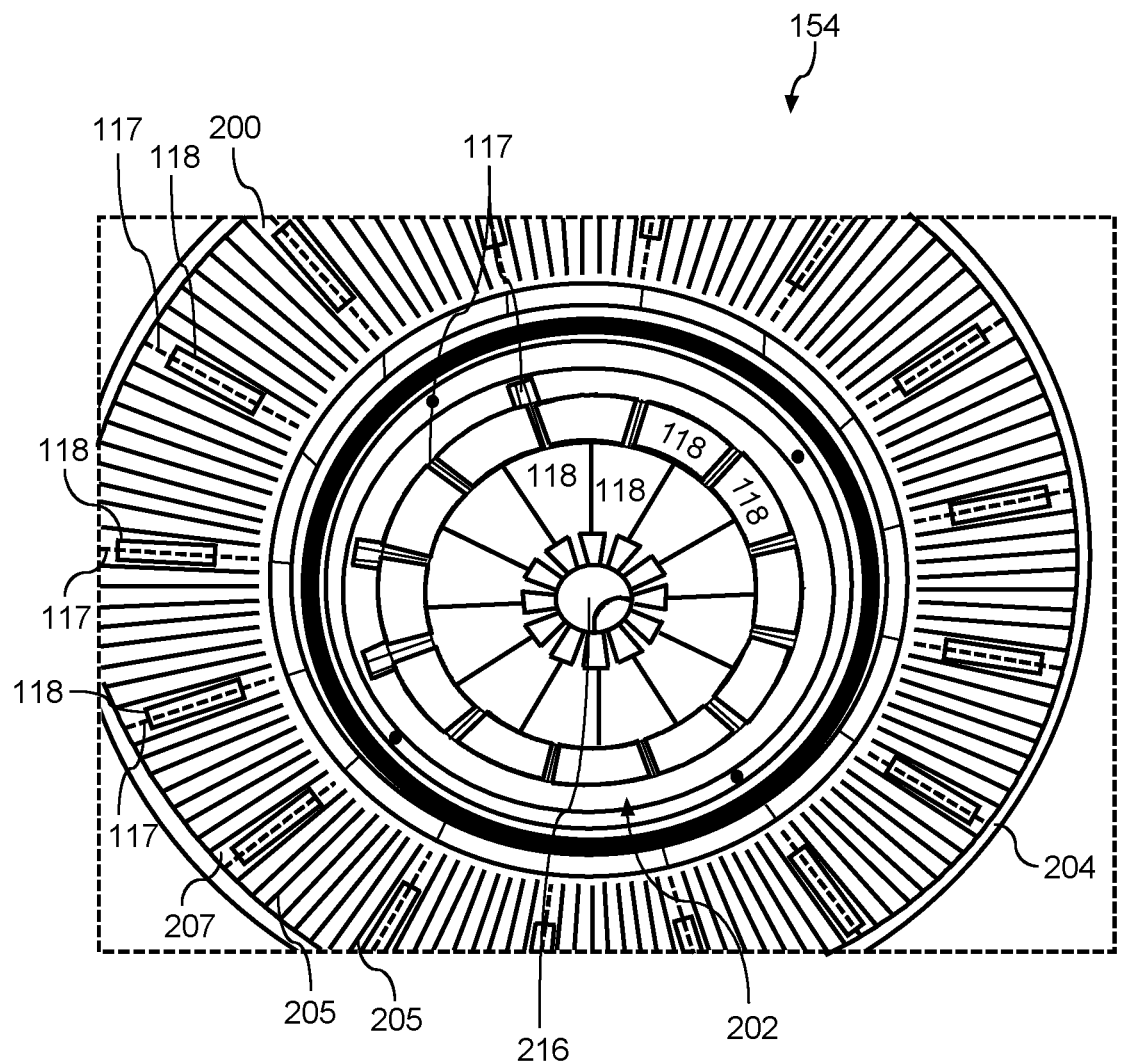
FIG. 5 depicts an example bottom up view of a Faraday shield for a plasma processing apparatus according to example embodiments of the present disclosure.

Referring now to FIG. 5, one or more heating elements 117 and one or more thermal pads 118 can be disposed on the Faraday shield 154. For example, in certain embodiments, one or more heating elements 117 can be disposed on the inner portion 202 of the Faraday shield 154. In embodiments, the one or more heating elements 117 can be disposed in a radial pattern on the inner portion 202 of the Faraday shield 154. For example, one or more heating elements 117 can be disposed on the spokes 206 of the inner portion 202 of the Faraday shield 154. In certain other embodiments, one or more heating elements 117 can be disposed between one or more spokes 206 of the inner portion 202 of the Faraday shield 154. In certain embodiments, one or more heating elements 117 can be disposed on the outer portion 202 of the Faraday shield 154. For example, one or more heating elements 117 can be disposed in a radial pattern on the outer portion 200 of the Faraday shield 154. In certain embodiments, one or more heating elements 117 can be disposed on the one or more spokes 207 of the outer portion 200 of the Faraday shield 154. For example, one or more heating elements 117 can be disposed between the one or more apertures 205 on the outer portion 200 of the Faraday shield 154. Furthermore, the heating elements 117 are disposed on a surface of the Faraday shield 154 that faces the dome 112.

Furthermore, depending on the placement of the heating elements 117, one or more thermal pads 118 can be disposed on the Faraday shield 154 such that when the Faraday shield 154 is disposed on the apparatus 100, the thermal pads 118 make contact with the dome 112. For example, in embodiments where the heating elements 117 are disposed on the spokes (206,207), the one or more thermal pads 118 can be disposed on the spokes 206,207 between the heating elements 117 and the dome 112. In certain embodiments, the thermal pads 118 can be coupled to the heating elements 117 using any suitable adhesive.

Figure 6:
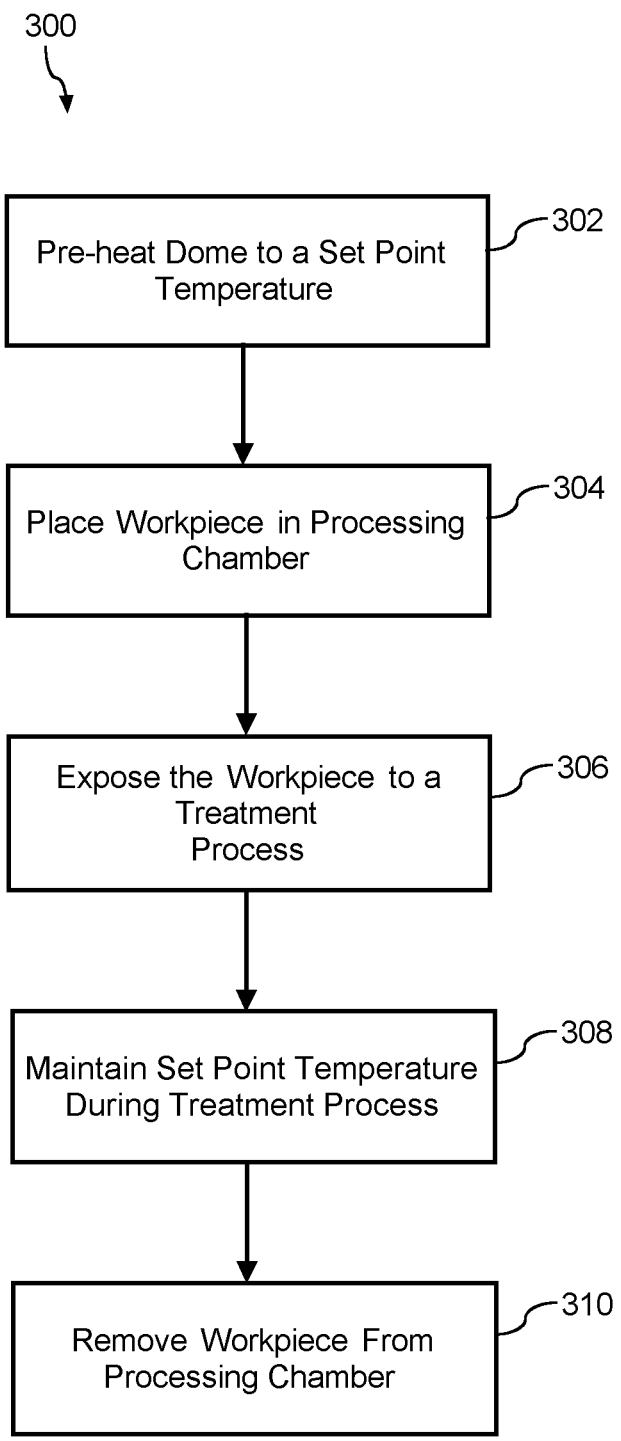
FIG. 6 depicts the heating effect on dome temperature for example plasma processing apparatuses according to example embodiments of the present disclosure.

FIG. 6 depicts a flow diagram of one example method (300) according to example aspects of the present disclosure. The method (300) will be discussed with reference to the plasma processing apparatus 100 of FIG. 1 by way of example. The method (300) can be implemented in any suitable plasma processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302), the method can include pre-heating the dome 112 to a set point temperature. For example, one or more heating elements 117 can be operated in order to increase the dome temperature from ambient to a desired set point temperature. For instance, a set point temperature can be determined and provided to the controller 175. The controller 175 can include one or more processors and one or more memory devices. The memory device can store and implement computer readable instructions. Accordingly, when the desired set point temperature is provided to the controller 175, the controller 175 can operate components of the thermal management system 180 (e.g., heating elements 117 or air amplifier 182) in order to achieve the desired set point temperature for the dome. For instance, the controller 175 can operate the one or more heating elements 117 in order to increase the temperature of the dome to the set point temperature. In other embodiments, where the dome is above the set point temperature, the controller can operate the air amplifier 182 in order to cool the dome to the desired set point temperature. Advantageously, set point temperature can be reached without having to run plasma in the processing chamber 109 or provide dummy wafers in the processing chamber 109.

At (304), the method can include placing a workpiece 106 in the processing chamber 109 of a plasma processing apparatus 100. For instance, the workpiece 106 can be placed on a workpiece support 104 disposed in the processing chamber 109.

At (306), the method can include performing a treatment process on the workpiece 106. For example, the treatment process can include a plasma treatment process, a heat treatment process, or combinations thereof. In certain embodiments, the treatment process includes a plasma etch treatment process. The plasma etch treatment process can selectively remove one or more material layers from the workpiece 106. In other embodiments, the treatment process includes a plasma deposition process. For instance, the plasma deposition process can selectively deposit one or more material layer on the workpiece 106. Other plasma processes can be used to modify the material layers present on the workpiece. For example, plasma-based surface treatment processes can be utilized to modify the surface morphology of the workpiece or to modify the chemical composition of layers on the workpiece. Any other, known suitable plasma-based processing for workpieces can be performed on the workpiece 106.

At (308), the method can include maintaining the set point temperature during the treatment process. For example, a dome set point temperature can be provided to the controller 175. The controller 175 can then operate one or more components of the thermal management system 180 (e.g., the air amplifier 182 or the heating elements 117) in order to maintain a set point temperature for the dome 112 during workpiece processing. Furthermore, the controller 175 can operate a close-loop system in order to maintain set point temperature for the dome 112 during processing.

At (310) the method can include removing the workpiece from the processing chamber 109. For instance, the workpiece 106 can be removed from workpiece support 104 in the processing chamber 109. The plasma processing apparatus can then be conditioned for future processing of additional workpieces.

The following examples are illustrative examples including plasma processing apparatuses and features thereof as disclosed herein. The following examples illustrate the time for heating to a set point temperature for apparatuses incorporating features of the present disclosure versus plasma processing apparatuses that do not incorporate various features disclosed herein. The following examples are exemplary only and do not limit the present disclosure.

EXAMPLE 1

Figure 7:
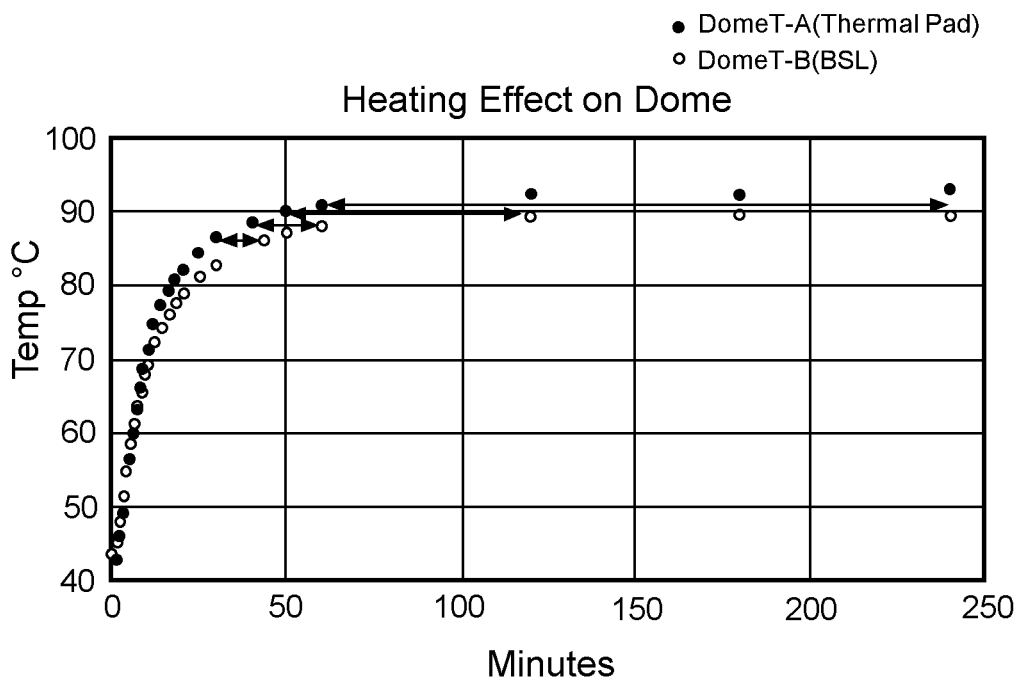
FIG. 7 depicts the heating effect on dome temperature for example plasma processing apparatuses according to example embodiments of the present disclosure.

Example 1 illustrates the heating effect on dome temperature with respect to a thermal management system incorporating aspects of the present disclosure as compared to other plasma processing systems. For example, Apparatus DomeT-A includes thermal pads disposed between the heating elements and the dome as described herein. Apparatus DomeT-B does not include thermal pads between the heating elements and the dome. Each apparatus was set to heat the dome to a set point temperature of 90° C. As shown in FIG. 7, Apparatus DomeT-A was able to reach a dome temperature of 90° C. more rapidly as compared to Apparatus DomeT-B. For example, Apparatus DomeT-A reached 90° C. after about 50 minutes of heating, whereas Apparatus DomeT-B barely close to 90° C. after about 235 minutes of heating.

EXAMPLE 2

Figure 8:
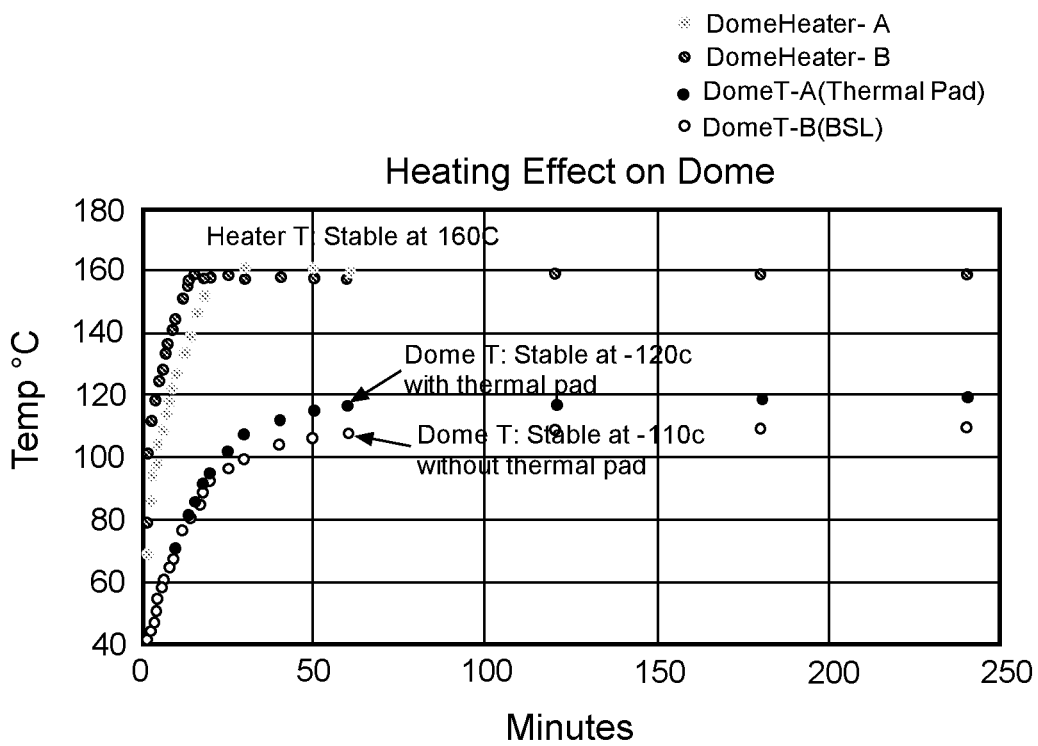
FIG. 8 depicts a flow chart diagram of a method for processing a workpiece according to example embodiments of the present disclosure.

Example 2 illustrates the heating effect on dome temperature with respect to a thermal management system incorporating aspects of the present disclosure as compared to other plasma processing systems. For example, Apparatus DomeT-A includes thermal pads disposed between the heating element and the dome as described herein. Apparatus DomeT-B does not includes thermal pads between the heating elements and the dome. The heater temperatures for DomeT-A and DomeT-B are also shown. (See DomeHeater-A and DomeHeater-B, respectively). As shown, both dome heaters (DomeHeater-A and DomeHeater-B) were set to operate at 160° C. As shown in FIG. 8, Apparatus DomeT-A was able to reach and sustain a dome temperature of about 120° C. after a little over 50 minutes of heating. Apparatus DomeT-B, however, was unable to reach a dome temperature of 120° C. even after 250 minutes of heating.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing apparatus, comprising:
a processing chamber having one or more sidewalls and a dome;
a workpiece support disposed in the processing chamber configured to support a workpiece during processing;
an induction coil assembly for producing a plasma in the processing chamber;
a Faraday shield disposed between the induction coil assembly and the dome, the Faraday shield comprising an inner portion and an outer portion, wherein the inner portion of the Faraday shield is raised in the Z-direction with respect to the outer portion of the Faraday shield, wherein the outer portion includes one or more apertures extending from the inner portion to an outer perimeter of the Faraday shield;
a thermal management system including:
one or more heating elements configured to heat the dome; and
one or more thermal pads disposed between an outer surface of the dome and the heating elements, wherein the one or more thermal pads are configured to facilitate heat transfer between the one or more heating elements and the dome, wherein the one or more thermal pads have a thermal conductivity of from about 0.5 W/m-K to about 1.5 W/m-K.

2. The plasma processing apparatus of claim 1, wherein the one or more heating elements comprise one or more electrically-charged films.

3. The plasma processing apparatus of claim 1, wherein the one or more heating elements are disposed in a radial pattern on the inner portion of the Faraday shield.

4. The plasma processing apparatus of claim 1, wherein the induction coil assembly is disposed adjacent to an external surface of the outer portion of the Faraday shield.

5. The plasma processing apparatus of claim 1, wherein the thermal management system comprises an air amplifier configured to provide a flow of air to cool the dome.

6. The plasma processing apparatus of claim 5, wherein the Faraday shield comprises one or more apertures disposed on the inner portion configured to facilitate a flow of air through the one or more apertures on the Faraday shield to or from an external surface of the dome.

7. The plasma processing apparatus of claim 1, comprising a controller configured to control the thermal management system in a closed-loop manner.

8. The plasma processing apparatus of claim 1, wherein the thermal management system is configured to heat the dome to a set point temperature.

9. The plasma processing apparatus of claim 1, wherein the thermal management system is configured to maintain a set point temperature during processing of the workpiece.

10. The plasma processing apparatus of claim 8 or 9, wherein the set point temperature is from about 50° C. about 150° C.

11. The plasma processing apparatus of claim 1, wherein the one or more heating elements can be configured to heat at an operating temperature of from about 70° C. to about 200° C.

12. The plasma processing apparatus of claim 1, wherein the one or more thermal pads have a thickness of from about 10 mil to about 100 mil.

13. The plasma processing apparatus of claim 1, wherein the one or more thermal pads are disposed between the one or more heating elements and the dome such that substantially no air gaps exist between the one or more heating elements and the thermal pads, and wherein substantially no air gaps exist between the one or more thermal pads and the dome.

14. The plasma processing apparatus of claim 1, wherein the one or more thermal pads are configured to have a compression of from about 10% to about 40% of an original volume, when placed between the one or more heating elements located on the Faraday shield and the top of the dome.

15. The plasma processing apparatus of claim 1, comprising a gas delivery system configured to supply one or more process gases to the processing chamber.

16. The plasma processing apparatus of claim 1, wherein the induction coil assembly is configured to be coupled to an RF power source.

17. The plasma processing apparatus of claim 1, wherein the one or more thermal pads are coupled to the one or more heating elements with an adhesive.

18. A thermal management system for a plasma processing apparatus, the system comprising:
one or more heating elements configured to heat a dome of a processing chamber;
a Faraday shield disposed on the dome, the Faraday shield comprising an inner portion and an outer portion wherein the inner portion of the Faraday shield is raised in the Z-direction with respect to the outer portion of the Faraday shield, wherein the outer portion includes one or more apertures extending from the inner portion to an outer perimeter of the Faraday shield;
one or more thermal pads disposed between an outer surface of the dome and the one or more heating elements;
an air amplifier configured to provide a flow of air to cool the dome; and
a controller, the controller configured to operate the thermal management system in a closed-loop manner in order to maintain the dome at a set point temperature.

19. The plasma processing apparatus of claim 1, wherein the inner portion of the Faraday shield comprises one or more spokes disposed between an inner perimeter and an outer perimeter of the inner portion, the inner portion comprising one or more apertures disposed between the one or more spokes, the one or more apertures configured to receive air flow from an air amplifier to facilitate cooling of an external surface of the dome.

* * * * *